United States Patent [19]

Cuomo, Jr.

[11] 3,976,288

[45] Aug. 24, 1976

[54] SEMICONDUCTOR WAFER DICING FIXTURE

[75] Inventor: Salvatore Ralph Cuomo, Jr., Wappingers Falls, N.Y.

[73] Assignee: IBM Corporation, Armonk, N.Y.

[22] Filed: Nov. 24, 1975

[21] Appl. No.: 634,693

[52] U.S. Cl. ................................. 269/21; 269/291
[51] Int. Cl.² .......................................... B25B 11/00
[58] Field of Search ............. 264/21, 288, 290, 291; 51/235

[56] References Cited
UNITED STATES PATENTS

| | | | |
|---|---|---|---|
| 3,294,392 | 12/1966 | Dunham | 269/21 |
| 3,318,352 | 5/1967 | Seltzer | 269/288 X |
| 3,711,081 | 1/1973 | Cachm | 269/21 |
| 3,851,758 | 12/1974 | Makhijani et al. | 269/21 |
| 3,865,359 | 2/1975 | Caroli | 269/21 |

*Primary Examiner*—Al Lawrence Smith
*Assistant Examiner*—Robert C. Watson
*Attorney, Agent, or Firm*—William J. Dick

[57] ABSTRACT

This patent discloses apparatus for retaining a semiconductor wafer in a predetermined position or orientation to permit dicing of the wafer into discrete semiconductor chips of a predetermined size without dislocation of the chips during the dicing operation, the chips being arranged in columns and rows with a kerf area intermediate adjacent chips. The apparatus comprises a base member having a semicondcutor wafer positioning area with a connection to the base member for applying the vacuum to a plurality of spaced apart apertures in the wafer receiving area, the apertures corresponding to the location of the chips. A cover plate, adapted for superimposition of the wafer receiving area, includes a plurality of interdigitated ribs and slots, the slots extending through the cover and dimensioned for alignment with the kerf area of the wafer, the ribs having strips of compressible material underlying the ribs for superimposed pressing relation on the wafer so that when a wafer is being cut through the slots along the kerf area, the vacuum being drawn coupled with the pressing engagement of the strips on the wafer inhibit dislocation of the chips during the dicing operation.

11 Claims, 6 Drawing Figures

SEMICONDUCTOR WAFER DICING FIXTURE

SUMMARY OF THE INVENTION AND STATE OF THE PRIOR ART

The present invention relates to a fixture for retaining a workpiece in a predetermined orientation while a work operation is performed on the workpiece, and more particularly relates to a fixture for holding or retaining a semiconductor wafer in a predetermined position to permit dicing of the wafer into discrete semiconductor chips of a predetermined size without dislocation of the chips during the dicing operation.

In the manufacture of integrated circuits, it is common practice to reproduce the circuit design on a silicon semiconductor wafer, the wafer having anywhere from 200 to 1,000 or more discrete duplications of the particular device or circuit desired impressed therein. After the processing is completed, the wafer is diced by either a laser, slurry type saw or band saw so as to separate the circuits or components into discrete chips, the chips then being bonded to a substrate for mounting on a card, the cards being placed into the machine for which the circuits were designed. It is conventional practice, during the dicing operation and to prevent the semiconductor wafer from moving while the wafer is being diced, to bond the wafer to a substrate, such as a phenolic block, by a bonding agent such as a glycol pthallate and, after dicing, to immerse the block into a solvent (such as methylene flouride) which may be agitated to release the chips from the substrate. Thereafter the chips are removed and placed in a file, box or other container and subsequently orientated at a placement machine and the like for placing the chips onto a substrate.

Because of the damage to the chips when pouring the chips into a container, and inasmuch as it is desirable to retain the orientation of the chips of the wafer, which is known prior to the dicing step, a system was developed for holding the diced semiconductor wafer chips in a predetermined orientation while pumping a solvent against the chips to remove the bonding agent, and then while maintaining their orientation transfer the chips into a container or the like for future use in the manufacturing line. One such system is illustrated in U.S. Pat. No. 3,762,426 issued on Oct. 2, 1973 to the assignee of the present invention, and also disclosed in U.S. Pat. No. 3,851,758 issued on Dec. 3, 1974 to the present assignee. Another such system is shown in U.S. Pat. No. 3,809,050 issued on May 7, 1974. However, all of these systems require several "processing" and handling steps as well as adhesive bonding of the wafer to a substrate which leads to the possibility of further breakage and consequent economic loss.

Numerous attempts have been made to provide apparatus which will hold the semiconductor wafer for dicing thereof into discrete semiconductor chips without bonding the wafer to a separate substrate. All prior attempts at holding a wafer while it was diced without employing some kind of adhesive have generally been unsuccessful because of the tendency of the semiconductor chips to be dislocated during the dicing operation. Moreover, attempts to grasp the wafer more securely adjacent the lines of cut (generally in the kerf area intermediate adjacent chips) has proved unsuccessful due to the damage caused by the gripping means to the surface geometry of the chip.

In view of the above, it is a principle object of the present invention to provide apparatus for holding a semiconductor wafer in a predetermined position to permit dicing of the wafer into discrete semiconductor chips of a predetermined size without dislocation of the chips during the dicing operation.

Another object of the present invention is to provide apparatus for permitting the foregoing object to be effective while eliminating the necessity for a number of the prior art process steps including the removal of the wafer from the substrate holding the wafer thereto by means of an adhesive, and thereafter the cleaning of the wafer of any adhesive.

Yet another object of the present invention is to provide a novel semiconductor wafer fixture which requires no adhesive connection between a substrate and the semiconductor wafer prior to the dicing step.

Yet another object of the present invention is to provide simple yet effective apparatus which may be easily manufactured and which will clamp a semiconductor wafer in a position which enables dicing of the wafer without dislocation and without damage to the upper surface of the wafer, while permitting holding of the chips in their original orientation upon separation of the fixture and after dicing.

Other objects and a more complete understanding may be had by referring to the following Specification and Claims taken in conjunction with the accompanying drawings in which;

Figure 1:
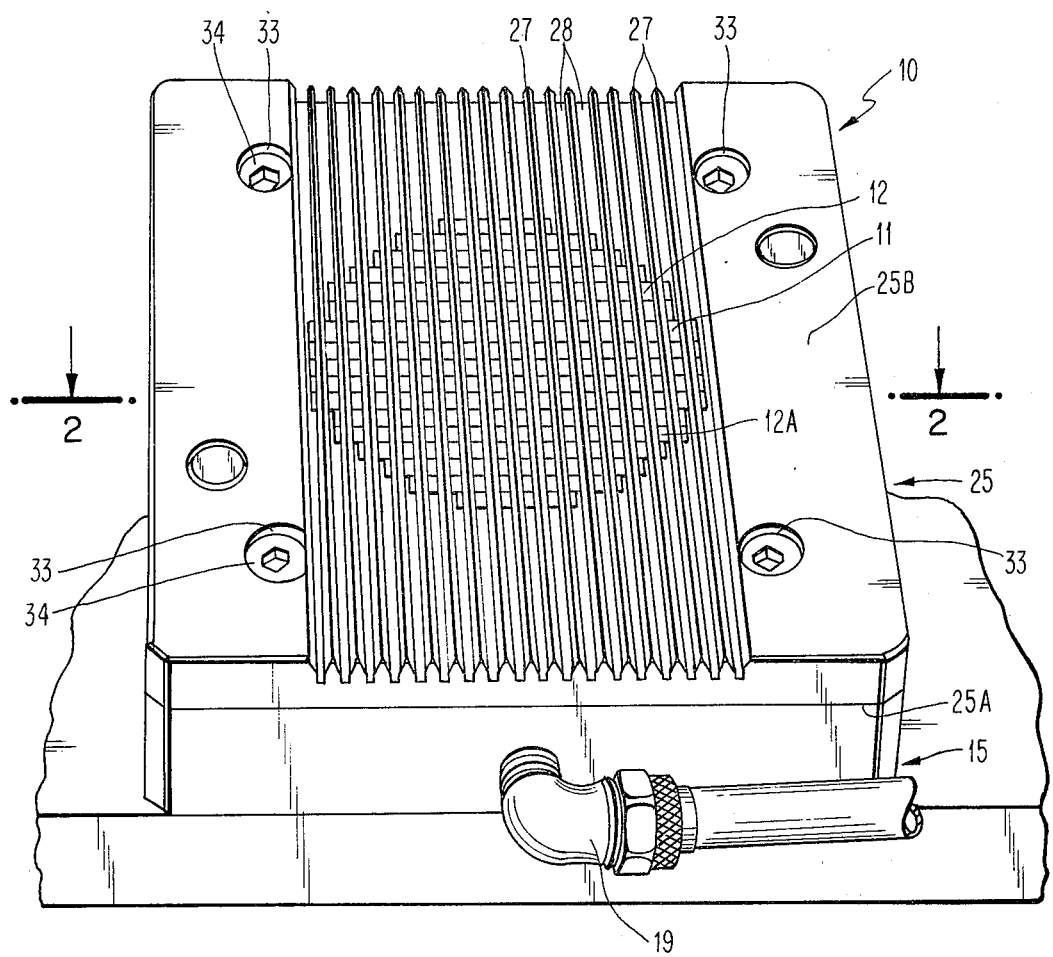
FIG. 1 is a fragmentary perspective view of apparatus constructed in accordance with the present invention.
Figure 2:
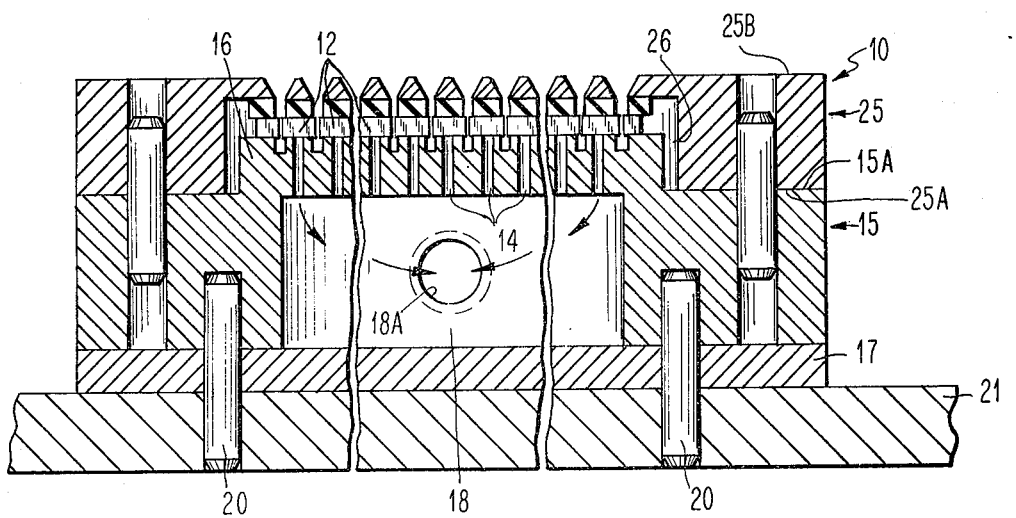
FIG. 2 is a fragmentary sectional view taken along line 2—2 of FIG. 1.
Figure 3:
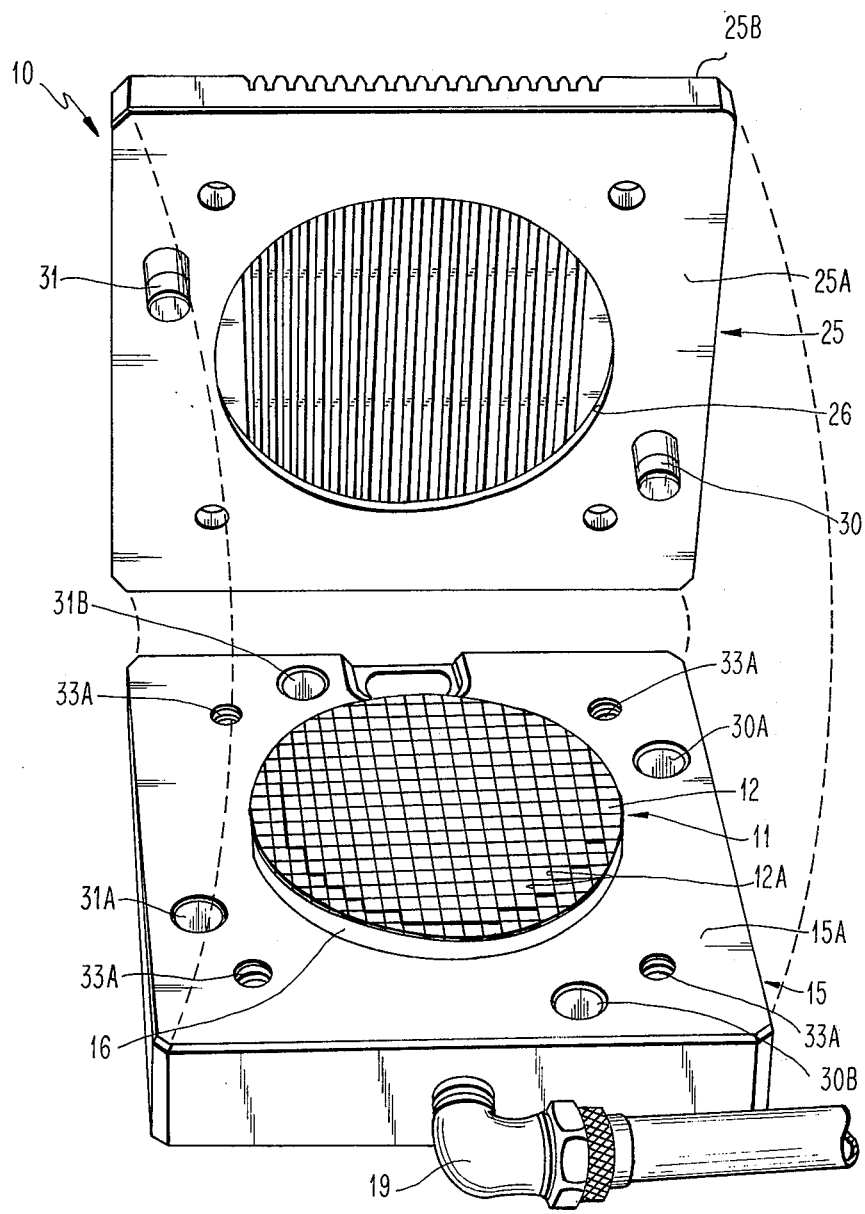
FIG. 3 is a perspective view of the apparatus illustrated in FIG. 1 and showing the apparatus in a separated condition.
Figures 4A, 4B:
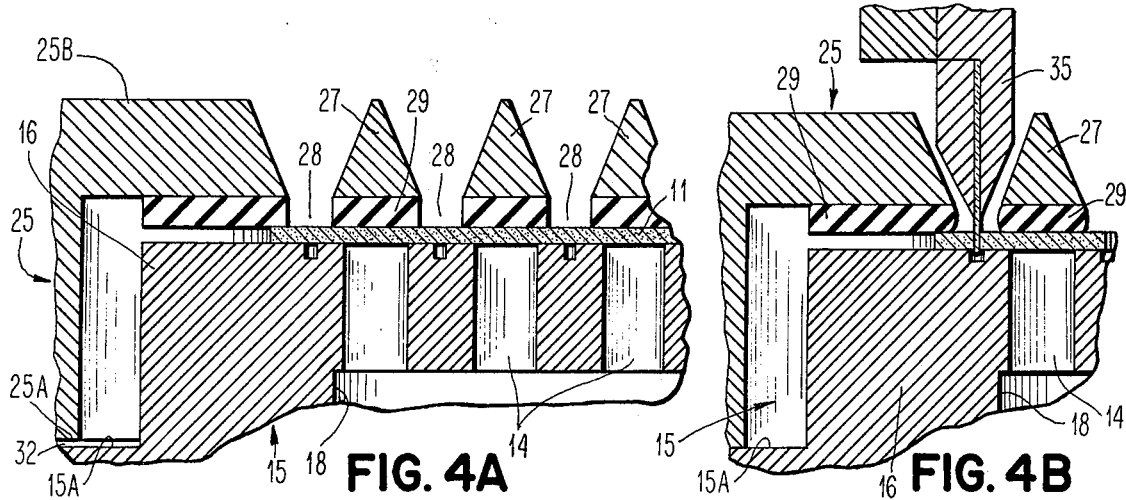
Figure 5:
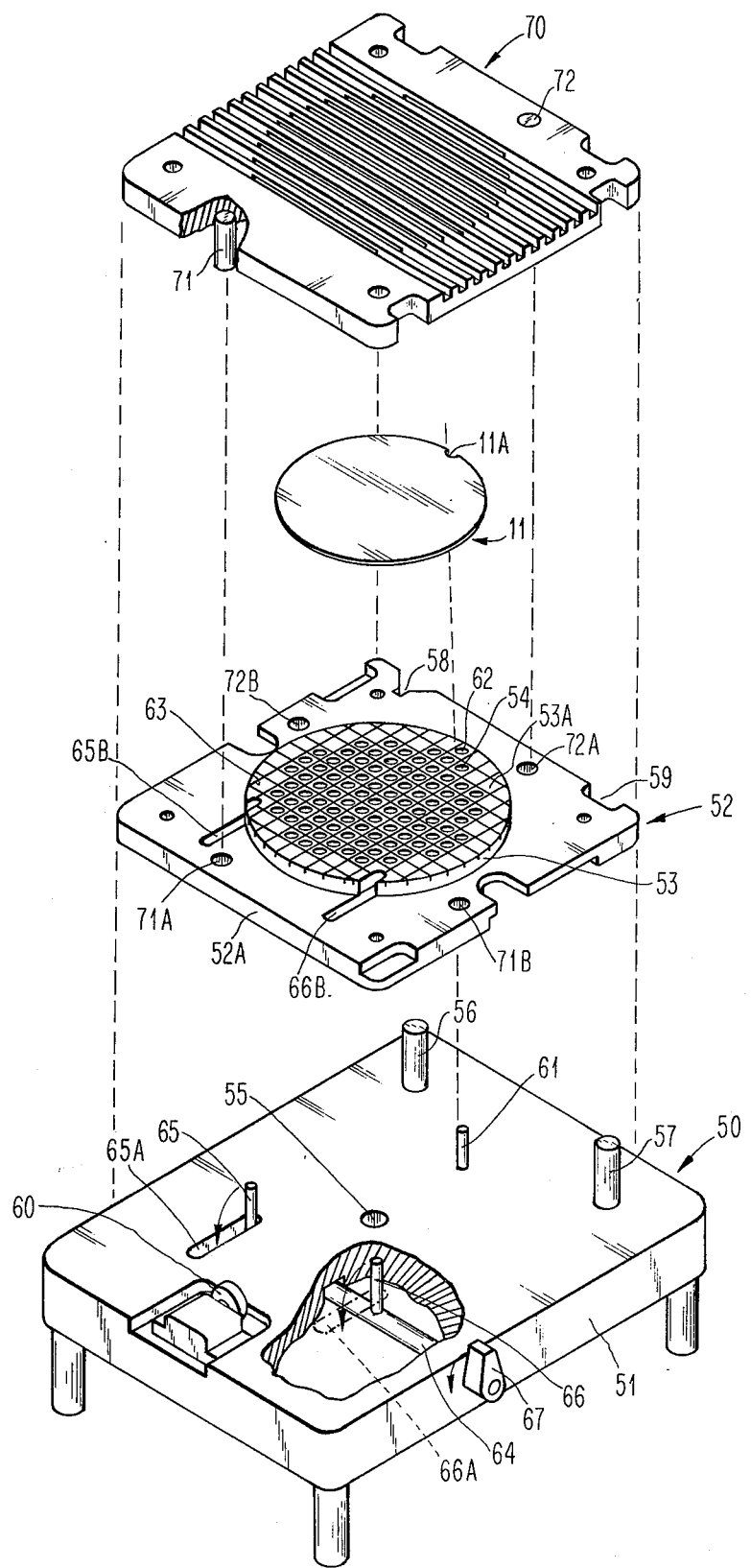

FIG. 4 is an enlarged fragmentary sectional view of a portion of the apparatus illustrated in FIGS. 1, 2 and 3; FIG. 4A illustrating the apparatus in a first position with a semiconductor wafer in position, and FIG. 4B illustrating the apparatus in a second and clamped position to permit dicing of the semiconductor wafer; and FIG. 5 is an exploded view of another embodiment of a fixture constructed in accordance with the present invention and which includes means for automatically aligning the semiconductor wafer in a predetermined position.

Turning now to the drawings, and especially FIG. 1 thereof, apparatus 10 for holding a semiconductor wafer 11 in a predetermined position to permit dicing of the wafer into discrete semiconductor chips 12 of a predetermined size without dislocation of the chips during the dicing operation, is illustrated therein. As is conventional practice, the chips with semiconductor circuit patterns, active and passive devices are arranged in columns and rows with a kerf area 12A intermediate adjacent chips.

In accordance with the invention, the wafer 11 is positioned in the fixture 10, the wafer being held by individual suction ports which are aligned with the intended chip cites, the wafer is clamped into its predetermined position by a cover plate and then the wafer is scored or cut along the kerf lines running first either in the column direction or the row direction; thereafter the cover is turned or rotated 90° and clamped in the orthogonal direction and a second scoring or cutting operation takes place in and along the kerf areas thus forming individual semiconductor chips. Thereafter the cover plate is removed and the chips may be transferred one by one to a storage bank or directly onto a substrate for connection thereto. To this end, and referring now to FIGS. 1, 2 and 3, the fixture 10 comprises a base member 15 including means defining a semiconductor wafer receiving area, in the illustrated instance a pedestal 16 which projects from the upper surface 15A of the base member. As shown best in FIG. 2, the base member 15 includes a bottom plate 17, and a central cavity 18 to which is connected means for applying a vacuum through an aperture 18A to the cavity 18, in the illustrated instance an elbow and pipe or hose connection 19. A plurality of spaced apart apertures or ports in the wafer receiving area 16 extend through the pedestal into the cavity 18 to provide fluid communication therewith. As shown, the apertures are spaced apart and positioned in the wafer receiving area so that at least one aperture underlies each individual chip 12 to be diced from the wafer. As shown, the base member 15 may be connected as by pins 20 to a work platform such as a table or the like 21.

After the wafer has been positioned on the semiconductor wafer receiving area or pedestal 16, and vacuum applied to the wafer as through the apertures 14, a cover plate 25 is releasably clamped to the base member 15 to press the wafer 11 against the receiving area and permit dicing of the wafer to be effected. To this end, and referring now to FIGS. 2, 3 and 4, the cover plate 25 includes a lower surface 25A adapted to mate with the upper surface 15A of the base member 15, in a manner hereinafter described. Centrally located in the cover plate 25 is a recess or cavity 26 which is dimensioned for receiving the wafer receiving area or pedestal 16 therein in nested relation. As best shown in FIGS. 1 and 2, the upper portion 25B of the cover plate 25 includes a plurality of interdigitated ribs 27 and slots 28, the slots 28 extending through the cover into the recess or cavity 26 and dimensioned for alignment with the kerf 12A of the chips 12 on the wafer 11.

In order to prevent damage to the surface of the wafer and particularly the semiconductor chips 12 underlying the ribs 27 when dicing takes place as by the saw 35, schematically illustrated in FIG. 4B, and at the same time to inhibit dislocation of the chips, at least the portion of the rib in confronting relation to the semiconductor comprises a resilient flexible material. In the illustrated instance each of the ribs 27 is provided with a strip 29 of resilient, compressible material which underlies the rib and is connected thereto for superimposed pressing relation on the wafer. The strips preferably may be composed of a material such as a 30 durometer rubber having a high coefficient of friction and exhibiting good compressibility and resilience features.

In order to effect proper alignment of the cover plate 25 to the base member 15, while insuring that the ribs 27 overlie the chips 12 and that the slots 28 are aligned with the kerf areas 12A of the chips 12, one of the cover plate and base member, in the illustrated instance the cover plate 25, is provided with a pair of depending, spaced apart lugs 30 and 31 which are adapted to register with apertures or holes 30A and 31A respectively in the base member 15. After the wafer 11 has been diced in one direction as by the saw 35 for example, the cover plate may be lifted and rotated 90°, the lugs 30 and 31 fitting into holes 30B and 31B respectively so that dicing or cutting may take place in a direction perpendicular to the first cut. Of course, if the chips are not squares but have a configuration such as a rectangle, a different cover plate may be employed for each dicing direction.

In order to insure proper pressing relation of the flexible strips 29 onto the surface 11 of the wafer, and as may best be seen in FIGS. 4A and 4B, the cover plate 25 forms a compressive interference fit with the base plate 15 which insures compression of the strips 29 and therefore retention of the wafer as it is cut by the dicing saw 35. As may be seen in FIG. 4A, with the cover plate 25 and the strips resting on the wafer 11, there is a small space 32 between the surface 15A of the base member 15 and the surface 25A of the cover plate 25. This means that the cover plate 25 must be pressed down to effect a compression of the strips 29 so as to press the wafer against the upper surface of the wafer receiving area or pedestal 16. Although any kind of clamping device may be employed, as illustrated best in FIG. 1, the cover plate is provided with holes 33 adjacent the ribs and slots which mate with threaded holes 33A in the base plate 15 to receive screws or the like 34 to clamp the cover plate 25 against the base member 15. When the cover plate 25 is clamped to the base member 15 the strips 29 assume a shape substantially as shown in FIG. 4B.

In production type cutting or dicing, it is desirable to provide means for fixing and locating the wafer relative to the wafer receiving area so that placing the cover plate first in one direction, dicing, loosening the cover plate and rotating it 90° and after reclamping, the second dicing cut may be made so as to form the chips. To this end, and as shown in FIG. 5, a production fixture is illustrated. In FIG. 5, the base member 50 is severable into a platform 51 and wafer mounting plate 52. As before, the base member includes a semiconductor wafer receiving area or pedestal 53 having a plurality of apertures 54 therein which communicate with a chamber (not shown) beneath the pedestal 53 and which is in fluid communication through an aperture 55 in the platform to a source of vacuum (not shown). The platform 51 includes a pair of upstanding wafer mounting plate alignment lugs 56 and 57, the wafer mounting plate including a v-block type notch 58 and a recess 59 for respectively engaging the lugs 56 and 57. In order to hold the mounting plate in a position whereby the lugs 56 and 57 engage respectively the v-block notch 58 and the recess 59, biasing means, in the illustrated instance a plunger 60 is provided to engage the trailing or rear edge 52A of the wafer mounting plate and press it into position against the lugs 56 and 57. Additionally, a pin 61 projecting upwardly from the platform 51 is adapted to engage and pass through an aperture 62 for purposes which will become more clear hereinafter. Suffice to say that the pin 61 is of sufficient length to project above the upper surface 53A of the pedestal or wafer receiving area 53 when the wafer mounting plate 52 is in position on the platform 51.

As is conventional practice, semiconductor wafers 11 which are cut from a boule of crystal material such as silicon, contain a notch 11A along one edge thereof so that devices may be processed in and on the wafer in a predetermined orientation with respect to the crystallographic structure of the semiconductor material. Thus the lines 63 shown on the upper surface of the pedestal 53 represent the dicing lines or the lines intermediate the chips, commonly called the kerf areas. With the wafer 11 in position on the wafer receiving area, and the notch 11A in engagement with the pin 61 (which passes through the aperture 62 in the receiving area), means are provided for gently pressing the wafer 11 against the pin 61 and creating a 3 point alignment of the wafer on the pedestal 53. To this end, an axle 64 is positioned in the platform 51 and includes a pair of axially spaced apart, radially projecting pins 65 and 66 which are rotatable about the axle as by a handle 67 and which pass through slots 65A and 66A in the platform. As shown, the wafer mounting plate 52 also includes elongated slots 65B, 66B which permit the pins 65 and 66 to rotate up into position into the pedestal or wafer receiving area 53 contacting the edge of the wafer 11 and pressing the wafer notch 11A against the pin 61. In this manner, the wafer is located exactly on the wafer receiving area.

Once the wafer is positioned on the wafer receiving area, the handle 67 is actuated lowering the pins 65 and 66 at least into the wafer mounting plate 52 and a cover plate 70 of substantially identical construction to the cover plate 25, hereinbefore described, is positioned in pressing, superimposed engagement over the wafer and connected to the wafer mounting plate so as to permit dicing of the wafer. As before, the cover plate 70 includes alignment lugs 71, 72 which mate with either apertures 71A, 72A or 71B, 72B located in the wafer mounting plate 52.

Thus the fixture of the present invention permits dicing of a semiconductor wafer into discrete chips without necessitating the adhesive bonding of the wafer to a substrate prior to the dicing step, the combination of the compression of the flexible strips along with the vacuum retention of the chips or wafer being sufficient to inhibit dislocation of the chips as the wafer is diced.

Although the invention has been described with a certain degree of particularity, it is understood that the present disclosure has been made only by way of example and that numerous changes in the details of construction and the combination and arrangement of parts and the mode of operation may be made without departing from the spirit and the scope of the invention as hereinafter claimed.

What is claimed is:

1. Apparatus for holding a semiconductor wafer in a predetermined position to permit dicing of the wafer into discrete semiconductor chips of a predetermined size without dislocation of said chips during the dicing operation, said chips being arranged in the wafer with a kerf area intermediate adjacent chips;
    said apparatus comprising:
    a base member having means defining a semiconductor wafer receiving areas;
    means connected to said base member for applying a vacuum thereto;
    a plurality of spaced apart apertures in said wafer receiving area and extending into said base member to provide fluid communication with said means for applying a vacuum to said base member;
    said apertures being positioned in said wafer positioning area so that at least one aperture underlies each individual chip to be diced from said wafer;
    a cover plate having a plurality of interdigitaged ribs and slots, said slots extending through said cover and dimensioned for alignment with the kerfs of said chips;
    at least the portion of said rib in confronting relation to said semiconductor wafer receiving area including a resilient compressible material, said resilient compressible material adapted for superimposed pressing relation on a wafer so that when a wafer is being cut through said slots, the vacuum being drawn coupled with the pressing engagement of the ribs on said wafer inhibit dislocation of said chips during a dicing operation.

2. Apparatus in accordance with claim 1 wherein one of said wafer receiving area and said cover plate includes a pedestal, and the other of said cover plate and wafer receiving area includes a recess adapted to circumscribe said pedestal.

3. Apparatus in accordance with claim 2 wherein said resilient compressible material extends into said recess, and said cover plate and base member include mating surfaces adapted to be pressed together in mating face to face relation when a wafer is on said pedestal so that compression of said resilient compressible material is insured against said wafer.

4. Apparatus in accordance with claim 3 wherein said portion of said rib comprising said resilient compressible material includes a separate strip of material connected to each of said ribs.

5. Apparatus in accordance with claim 4 wherein said strip of material comprises rubber.

6. Apparatus in accordance with claim 1 including means to precisely position said wafer on said wafer receiving area.

7. Apparatus in accordance with claim 6 wherein said means to precisely position said wafer on said wafer receiving area comprises a three point locator.

8. Apparatus in accordance with claim 6 wherein said base member comprises a platform and a wafer mounting plate having said wafer receiving area thereon; alignment means for aligning and clamping said wafer mounting plate on said platform in a predetermined position.

9. Apparatus in accordance with claim 8 wherein said alignment means comprises spaced apart post members and like spaced apart notch members one of said post members and notch members being on said platform and the other of said post members and notch members being on said wafer mounting plate.

10. Apparatus in accordance with claim 1 including means to clamp said cover plate to said base member.

11. Apparatus in accordance with claim 10 including alignment means associated with each of said base member and said cover plate to effect mating, orthogonal alignment between said base member and said cover plate.

\* \* \* \* \*